(12) United States Patent
Chen et al.

(10) Patent No.: US 6,542,095 B1
(45) Date of Patent: Apr. 1, 2003

(54) UNIVERSAL VARIABLE LENGTH CODE (UVLC) ENCODER

(75) Inventors: Liang-Gee Chen, Hsin-Tien (TW); Tu-Chih Wang, Shih-Chih (TW)

(73) Assignee: Taiwan University, Taipei (TW)

( * ) Notice: Subject to any disclaimer, the term of this patent is extended or adjusted under 35 U.S.C. 154(b) by 0 days.

(21) Appl. No.: 10/014,538

(22) Filed: Dec. 14, 2001

(51) Int. Cl.$^7$ ................................................ H03M 7/40
(52) U.S. Cl. ............................................. 341/67; 341/65
(58) Field of Search ............................... 341/65, 67, 50

(56) References Cited

U.S. PATENT DOCUMENTS 4,899,149 A  *  2/1990  Kahan ........................ 341/67

* cited by examiner

*Primary Examiner*—Peguy JeanPierre
*Assistant Examiner*—Joseph J Lauture
(74) *Attorney, Agent, or Firm*—Bacon & Thomas, PLLC

(57) ABSTRACT

A Universal Variable Length Code (UVLC) encoder for H.26L is provided. This encoder is simple and efficient due to the change of codeword number and codeword alignment technique. The look-up table could absorb the effect of codeword number's change on the previous stage of H.26L encoding. And there is no side effect on complexity of the whole system.

The header information coding and byte alignment function could also be integrated in this architecture.

3 Claims, 1 Drawing Sheet

UNIVERSAL VARIABLE LENGTH CODE (UVLC) ENCODER

FIELD OF THE INVENTION

The present invention relates to an encoder adaptable to UVLC (Universal Variable Length Code), and more particularly to an encoder that can achieve the UVLC coding requirements of TML6 in H.26L video compression standard.

BACKGROUND OF THE INVENTION

VLC (Variable Length Code) coding is a method to eliminate statistical redundancy in compression algorithm, and is generally the last step in video compression algorithm.

Conventional VLC coding will find the best coding value for the actual data according to statistical characteristics thereof so as to achieve the compression effect.

In H.26L, VLC will have a constant probability distribution that is called UVLC (Universal Variable Length Code). Whether a UVLC can really achieve the compression effect or not depends upon whether the input thereof complies with the constant probability distribution. In H.26L, some look-up tables are used before UVLC coding, in order to modify the input to comply with the constant probability distribution.

The coding of UVLC is a brand-new method, and there is no any hardware that implements the UVLC up to the present day.

OBJECT OF THE INVENTION

It is therefore an object of the present invention to provide an UVLC (Universal Variable Length Code) encoder that can comply with the H.26L standard. The encoder is very simplified by modifying the codeword number and utilizing a codeword alignment technique, while a look-up table can absorb the effect of codeword number's change before the H.26L coding, thus there is no any effect the whole system.

DETAILED DESCRIPTION OF THE INVENTION

Figure 1:
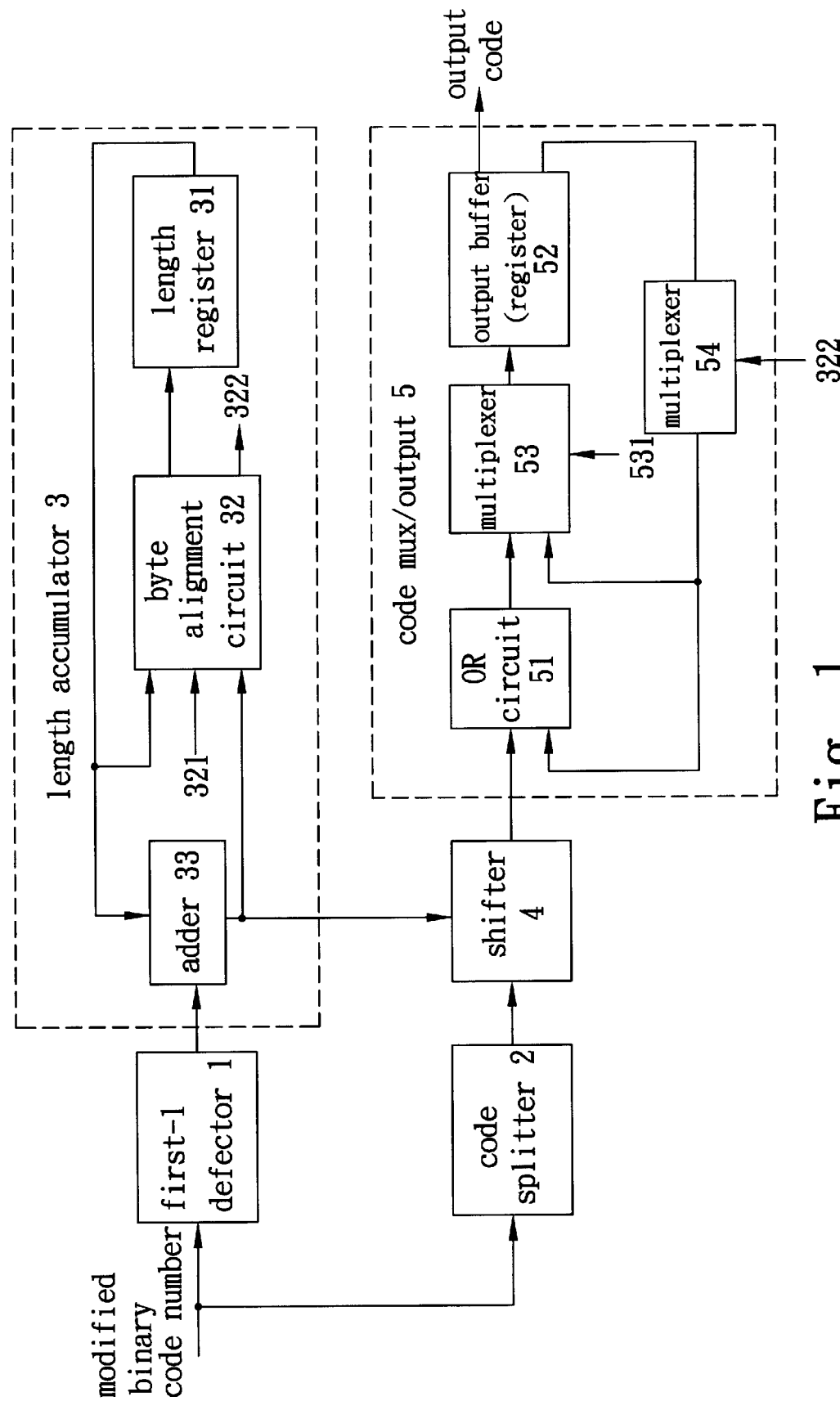
FIG. 1 shows the circuit block diagram of the UVLC (Universal Variable Length Code) encoder according to the present invention.

UVLC coding of a universal probability distribution proposed by H.26L standard, the rule thereof is as below:

| Codeword number | Output |
|---|---|
| 0 | 1 |
| 1 | 001 |
| 2 | 011 |
| 3 | 00001 |
| 4 | 00011 |
| 5 | 01001 |
| 6 | 01011 |
| 7 | 0000001 |
| 8 | 0000011 |
| 9 | 0001001 |
| 10 | 0001011 |
| 11 | 0100001 |
| 12 | 0100011 |
| 13 | 0101001 |
| 14 | 0101011 |
| 15 | 000000001 |

The rule of the above coding is very easy as shown below. Basically, the output comprises a data part of two bits and an ending part of one bit. The data part begins with "0", while the ending part is "1".

$$
\begin{array}{ccccccccc}
 & & & & 1 & & & & \\
 & & & 0 & x_0 & 1 & & & \\
 & & 0 & x_1 & 0 & x_0 & 1 & & \\
 & 0 & x_2 & 0 & x_1 & 0 & x_0 & 1 & \\
0 & x_3 & 0 & x_2 & 0 & x_1 & 0 & x_0 & 1
\end{array}
$$

FIG. 1 shows the circuit block diagram of the UVLC (Universal Variable Length Code) encoder according to the present invention. The UVLC encoder of the present invention comprises a first-1 detector 1 to detect the position of the first "1" from the most significant bit (MSB), a code splitter 2, a length accumulator 3, a shifter 4 and a code mux/output 5. The length accumulator 3 comprises a length register 31, a byte alignment circuit 32, and an adder 33.

The UVLC encoder of the present invention uses a modified input number as the input. The relation between the modified input number and the original codeword number of H.26L is as below:

modified input number=codeword number of H.26L+1

The modified input number relates directly to the actual output. Since the input number is obtained by a look-up table in the previous stage, there is no any effect on complexity of the whole system.

The modified input number is binary coded as shown in the third column of the table below:

H.26L codeword no. modified input no. binary code H.26L code length H.26L code output

| | | | | |
|---|---|---|---|---|
| 0 | 1 | 00001 | 1 | 1 |
| 1 | 2 | 00010 | 3 | 001 |
| 2 | 3 | 00011 | 3 | 011 |
| 3 | 4 | 00100 | 5 | 00001 |
| 4 | 5 | 00101 | 5 | 00011 |
| 5 | 6 | 00110 | 5 | 01001 |
| 6 | 7 | 00111 | 5 | 01011 |
| 7 | 8 | 01000 | 7 | 0000001 |
| 8 | 9 | 01001 | 7 | 0000011 |
| 9 | 10 | 01010 | 7 | 0001001 |
| 10 | 11 | 01011 | 7 | 0001011 |
| 11 | 12 | 01100 | 7 | 0100001 |
| 12 | 13 | 01101 | 7 | 0100011 |
| 13 | 14 | 01110 | 7 | 0101001 |
| 14 | 15 | 01111 | 7 | 0101011 |
| 15 | 16 | 10000 | 9 | 000000001 |

It is found that the position of the first "1" from MSB relates regularly to the length of the H.26L code output, the relation is shown in column 4, and is completely the same as the length of the H.26L code output.

In the third column of the above table, if a "0" is inserted before each bit after the first "1" from MSB, and a "1" is added at the end, the H.26L code output is obtained. Utilizing these characteristics, the modified input number is binary coded and then imputted to the first-1 detector 1 and the code splitter 2 of the present invention to obtain the H.26L code length and the H.26L code output.

The truth table of the first-1 detector 1 of the present invention is as below:

| Input (binary code) | output(H.26L code length) |
|---|---|
| 0000000000000001 | 1 |
| 000000000000001x | 3 |
| 00000000000001xx | 5 |
| 0000000000001xxx | 7 |
| 000000000001xxxx | 9 |
| 00000000001xxxxx | 11 |
| 0000000001xxxxxx | 13 |
| 000000001xxxxxxx | 15 |
| 00000001xxxxxxxx | 17 |
| 0000001xxxxxxxxx | 19 |
| 000001xxxxxxxxxx | 21 |
| 00001xxxxxxxxxxx | 23 |
| 0001xxxxxxxxxxxx | 25 |
| 001xxxxxxxxxxxxx | 27 |
| 01xxxxxxxxxxxxxx | 29 |
| 1xxxxxxxxxxxxxxx | 31 |

The first-1 detector 1 is used to obtain the H.26L code length, while the length accumulator 3 is used to count the effective bits in the output buffer 52 stated below, and to decide how many bit shifting is required in the shifter 4.

The code splitter 2 of the present invention is basically a wiring module, in which each bit line of the binary code of the modified input number is preceded with a ground line to represent inserting "0", while a power line $V_{cc}$ is added at the end of the bit lines. For example, if the input is 0000 0000 0000 0010, the output of the code splitter 2 will be 00000000 00000000 00000000 000001001.

It is found that the output of the code splitter 2 exhibits "1001" at the end of the codoe, in which the last three bits "001" is just the code output, while the first "1" of the four bits is the bit that is used by the first-1 detector 1 to detect the length of the code. The additional first "1" of the four bits will be eliminated by self-alignment technique in the code mux/output 5 stated below.

The output of the code splitter 2 will be adjusted by the shifter 4 to comply with the required positions of the output buffer 52, and then enter into the required positions of the output buffer 5 through the code mux/output 5.

The code mux/output 5 comprises an OR circuit 51, an output buffer (register) 52 and two multilplexers 53, 54. The OR circuit 51 is used to combine the output of the shifter 4 and the output value feedback from the output buffer 52 through the multiplexer 54. When ther are some data to be output, a carry bit 322 in byte alignment circuit 32 (stated below) will be used as an indication for output and is connected to multiplexer 54 for instructing multiplexer 54 to shift the output of the ouput buffer 52 by 16 bits (i.e. ouput 16 bits). Another multiplexer 53 will refresh the input of the output buffer 52 only when there is a data enable signal 531.

Since the output of the ouput buffer 52 will be changed according to the input during each clock, the multiplexer 53, 54 must feedback the original value when there is no input. The arrangement of the multiplexers and the output buffer can be replaced by the technique of Gated Clock.

The additional first "1" bit outputted by the code splitter 2 will be overlapped with the last "1" bit of the previous H.26L code output in code mux/output 5, and due to the logic operation of the OR circuit 51, the additional first 1 bit is therefore eliminated.

The length accumulator 3 comprises a length register 31, a byte alignment circuit 32 and an adder 33, and is used to register the effective bit number in the ouput buffer 52. The byte alignment circuit 32 accepts a byte alignment instruction 321 to accumulate the output of the adder 33 to multiples of 8, and also accepts the feedback from the length register 31 to maintain the original value in the length register 31 when there is no input during the clock change. A carry bit 322 in the byte alignment circuit 32 is used to indicate that the output is available, and is connected to the multiplexer 54 for instructing the multiplexer 54 to shift the ouput of the output buffer 52 by 16 bits (i.e. output 16 bits).

The spirit and scope of the present invention depend only upon the following Claims, and are not limited by the above embodiments.

What is claimed is:

1. A universal variable length code encoder, an input thereof being a binary code input of a codeword added with 1, and output thereof being a code output, comprising:

a first-1 detector for detecting a position of the first "1" from a most significant bit of said binary code input, so as to determine a code length;

a code splitter for inserting before each bit line of said binary code input with a ground line to represent inserting "0", while inserting a power line after a last bit line of said binary code input to represent inserting "1";

a length accumulator for registering an effective bit number in an output buffer;

a shifter for shifting an output of the code splitter according to the output of said length accumulator, so as to align with a corresponding position in the output buffer;

a code mux/output, including an OR circuit, the output buffer, and two multiplexers, for combining the output of said shifter and an output of said output buffer, so as to obtain a correct code output.

2. A universal variable length code encoder according to claim 1, wherein a byte alignment circuit being included in said length accumulator for adjusting the output of said length accumulator to multiples of 8.

3. A universal variable length code encoder according to claim 1 or 2, wherein a carry bit in said length accumulator is used to indicate that an output is available.

* * * * *